Sept. 20, 1960 J. H. PORTER 2,953,752
CHOPPER-STABILIZED AMPLIFIER
Filed March 14, 1957
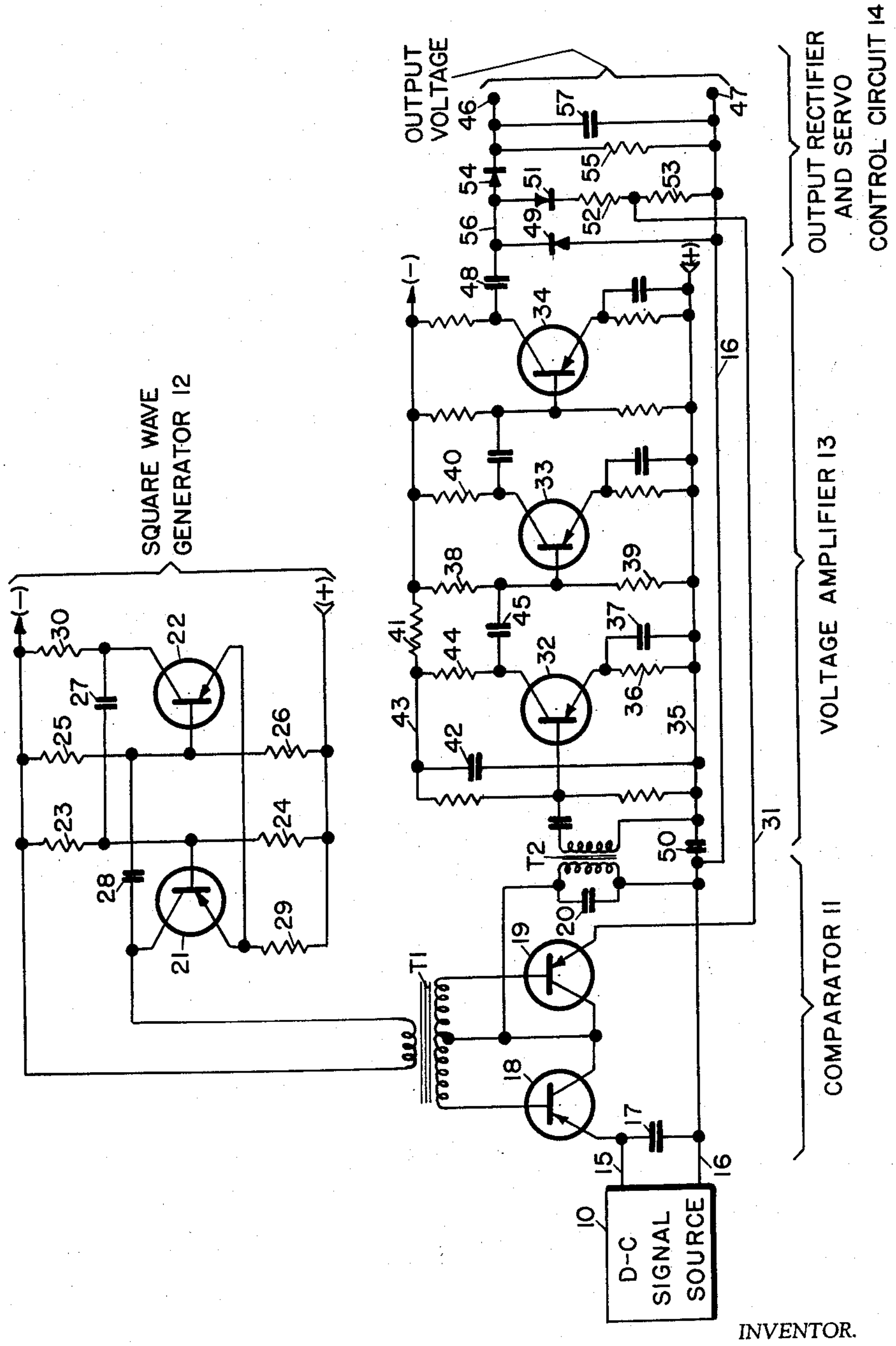
INVENTOR.
J. H. PORTER
BY George Vande Sande
HIS AGENT 2,953,752
Patented Sept. 20, 1960

2,953,752

CHOPPER-STABILIZED AMPLIFIER

John H. Porter, Rochester, N.Y., assignor to Portronics, Inc., Rochester, N.Y.

Filed Mar. 14, 1957, Ser. No. 645,996

11 Claims. (Cl. 330—9)

This invention relates to an amplifier circuit organization and more particularly pertains to an improved direct-current voltage amplifier having high gain stability over a variety of conditions.

An amplifier of direct-current voltages is of particular utility in the telemetering of various types of data when such data is available in the form of a continuously variable direct-current voltage analog. As one specific example, direct-current voltage amplifiers have been found to be highly desirable when it is desired to register at a remote location the temperature of the exhaust gases of a rocket engine. In such an application, a thermocouple is positioned at the location where temperature is to be measured. Its output is in the form of a direct-current voltage having its amplitude proportional to temperature. The amplitude is, however, very low, being ordinarily only in the order of a few millivolts and thus not suitable for recording directly. It is necessary, therefore, that this voltage first be amplified.

It is well-known in the art that amplifiers which are organized to amplify a direct-current input voltage directly are subject to considerable instability resulting particularly from the fact that direct coupling must be employed between successive stages rather than the capacitive coupling conventionally used in alternating-current amplifiers. As a result, various expedients have been devised to overcome this drawback, the principal one being to first convert the input direct-current voltage to a corresponding alternating-current voltage which can then be amplified in an alternating-current amplifier. The output of this alternating-current amplifier is then rectified and filtered, thereby providing an output voltage whose amplitude provides a measure of the amplitude of the direct-current input voltage. The conversion of the input direct-current voltage to an alternating-current signal is generally accomplished by so-called "choppers" of various types as, for example, the mechanical vibrator kind having an electro-mechanically actuated contact.

In amplifiers used for telemetering purposes it is essential that either the gain be fixed or some means be devised to counteract for gain variations. If this is not done, the amplifier output will not necessarily be a function of the input signal amplitude. This problem becomes particularly acute when a transistor amplifier is used since the gain of a transistor is inherently a function of its temperature. Accordingly, it has become the practice when transistor amplifiers are used to employ various temperature compensation expedients. Despite this, the gain of such an amplifier is still not entirely stable over a wide range of operating temperatures. In addition, the gain tends to vary considerably in accordance with the supply voltage amplitude and with the aging of various components, and the like.

In view of these defects associated with the direct-current voltage amplifiers of the prior art, it is proposed to provide, according to this invention, a novel amplifier organization wherein the signal actually being amplified is an alternating-current signal that is dependent not only upon the level of the input signal but is also at each instant a function of the amplifier gain. The resulting circuit organization operates in such a manner that the output signal amplitude is a true function of input signal amplitude and is almost entirely independent of variations in gain, whether caused by temperature variations, by drifting of the values of the various components as they age, or other reasons.

Described in a very brief manner and without attempting to define the scope of the invention in detail, it may be considered that an electrical displacement servo action is obtained whereby the signal that is actually amplified is an error signal representing at each instant the difference in amplitudes of the direct-current signal and a very small portion of the output signal. Although these two signals are both available in the form of direct-current voltages, the amplifier of this invention has been so devised that the actually amplified signal is an alternating-current voltage proportional in amplitude to the difference between these two different voltages.

It is, consequently, an object of this invention to provide an improved amplifier organization for the amplification of direct-current voltages and comprising a displacement servo type corrective action giving improved gain stability.

Another object of this invention is to provide a direct-current voltages amplifier wherein the signal actually amplified is an error signal that is a function of the amplifier gain, thereby providing automatic correction for any gain variations that occur.

An additional object of this invention is to provide a transistor amplifier for direct-current voltages employing a servo type of cooperation between the output and input thereof to give thereby a high stability of gain.

Other objects, features, and characteristics of this invention will in part be obvious from the accompanying drawing and in part pointed out as the description of the invention progresses.

In describing this invention in detail, reference will be made to the accompanying drawing which illustrates a circuit diagram of one specific embodiment of this invention.

To simplify the illustration and facilitate in the explanation of this invention, the various parts and circuits are shown diagrammatically and certain conventional illustrations have been used. The drawing has been made to make it easy to understand the principles and the manner of operation rather than to illustrate the specification construction and arrangement of parts that might be used in practice. The symbols (+) and (−) indicate connections to the opposite terminals of a source of relatively low voltage suitable for the operations of the various transistors that are shown.

The accompanying drawing illustrates in block form the direct-current signal source 10 that provides the signal it is desired to telemeter to some remote location. This signal source 10 may be a thermocouple, for example, or a direct-current excited strain gauge or any other device that provides as an output a low level, direct-current voltage proportional in amplitude to the physical quantity being measured. This signal is applied to a circuit organization designated as a comparator 11. The operation of this comparator 11 is controlled by a square wave generator 12. The output of the comparator is applied to a transistor voltage amplifier 13, the output of which is applied to the output rectifier and servo control circuit 14 where it is rectified and filtered to provide a direct-current voltage output that may be applied to any of various types of recording or metering devices. Additional rectifier means, independent of that used to provide the output signal, is effective to supply a small portion of the output signal back to the comparator 11. Thus, the comparator actually is provided with two different input signals, both of which are direct-current voltages. As will be shown, the comparator is organized in such a manner that the signal it supplies to the voltage amplifier is actually an alternating-current voltage whose amplitude is proportional to the difference in amplitudes between the signal provided by the direct-current signal source 10 and the signal provided by the output rectifier and servo control circuit 14.

The direct-current signal source 10 shown in the drawing may be at quite an appreciable distance from the amplifier so that the wires 15 and 16 may be of considerable length. As a result, extraneous voltages may be induced in these wires in certain installations, and for this reason the capacitor 17 is connected across the wires 15 and 16 at the amplifier location to suppress these extraneous voltages. This capacitor 17 also has the effect of reducing somewhat the high frequency response of the amplifier. However, this is not considered to be a serious disadvantage since an amplifier of this type is ordinarily required to amplify signals only within a very low frequency range such as that extending from 0 to about 10 cycles per second. At 10 cycles per second, the capacitor 17 still presents a relatively high impedance across the wires 15 and 16 but is still effective in reducing the amplitude of 60 or 400 cycle power frequencies and undesired transient pulses as well.

The comparator 11 comprises the two transistors 18 and 19 which are preferably of the p-n-p surface barrier junction type. The bases of these two transistors are connected to opposite terminals of the secondary winding of transformer T1. The collectors of both transistors 18 and 19 are connected to the center tap of this secondary winding. The emitter of transistor 18 is connected directly to wire 15, and the emitter of transistor 19 is connected to wire 31. A connection is also made from the collectors of these two transistors 18 and 19 to the upper terminal of the primary winding of transformer T2. The lower terminal of this primary winding is connected to the other input wire, and this primary winding is also shunted by the capacitor 20.

The comparator 11 has the primary winding of its transformer T1 energized by the output of the square-wave generator 12. This generator 12 comprises the two transistors 21 and 22 which are also shown as being of the p-n-p type. This square-wave generator 12 operates in the general manner of a free-running multivibrator in that it is effective to provide square-wave current pulses in the primary winding of transformer T1 at a predetermined frequency governed by the circuit constants of the generator.

The base of each of the transistors 21 and 22 is appropriately biased by being connected to the junction of a voltage divider connected between the (−) and (+) terminals. Thus, the base of transistor 21 is connected to the junction of resistors 23 and 24, while the base of the transistor 22 is connected similiarly to the junction of resistors 25 and 26. The base of transistor 21 is also connected through a coupling capacitor 27 to the collector of transistor 22. In a similar manner, the base of transistor 22 is connected through capacitor 28 to the collector of the other transistor 21. The emitters of both transistors are connected through a common biasing resistor 29 to the (+) terminal. The collector of transistor 22 is connected to the (−) terminal through resistor 30, while the collector of transistor 21 is connected to the same (−) terminal through the primary winding of transformer T1. For the predetermined operating frequency of the square-wave generator 12, the impedance of the primary winding of transformer T1 is preferably chosen to equal the resistance of resistor 30.

The operation of the square-wave generator can best be described by considering its behaviour when power is first applied. As a result of some slight asymmetry in either of the two transistors 21 or 22 or in the circuit components respectively associated therewith it can be assumed that there will be a slight unbalance in their collector currents at the instant the power is applied. If it is assumed that transistor 21 initially has a slightly greater collector current than transistor 22, then there will be a greater voltage drop across the primary winding of transformer T1 in the collector circuit of transistor 21 than across resistor 30 in the collector circuit of transistor 22. This tends to raise (make less negative) the collector of transistor 21 as compared to the collector of transistor 22. The coupling capacitor 28 cannot immediately discharge so that the base voltage of transistor 22 must, consequently, rise in amplitude. This rise of base voltage of transistor 22 causes it to conduct even less collector current so that its collector voltage tends to become more negative and approach the voltage level of the (−) supply. This voltage change is similarly coupled to the base of transistor 21 through the coupling capacitor 27 and lowers the base voltage of the transistor 21, thereby further raising the level of its collector current. A cumulative switching action thus takes place which very quickly causes transistor 21 to be fully conductive and transistor 22 to be fully cut off.

With the two transistors in this state, capacitor 28 now discharges through resistor 25 and through the collector-base junction of transistor 21. As the discharge current of capacitor 28 subsides, the base voltage of transistor 22 is lowered. When it has substantially reached the bias voltage established by the flow of emitter current of transistor 21 through the common emitter resistor 29, transistor 22 suddenly becomes conductive. By means of the rapid switching action described above, the relative conductive states of the two transistors are immediately reversed so that transistor 22 becomes fully conductive and transistor 21 fully cut off.

The period of the square-wave generator is established by the time constant of the discharge circuits provided for the respective coupling capacitors 27 and 28. In one specific embodiment of this invention, this was chosen so that the period was approximately 1.25 milliseconds, i.e. the generator 12 operated at a frequency of about 400 cycles per second. Preferably, the square-wave generator 12 should be organized to provide a symmetrical output waveform by causing the two transistors 21 and 22 to be alternately conductive for equal periods of time.

As transistor 21 is alternately made conductive and nonconductive in the manner described above, an alternating current having an essentially square wave-form flows in the primary winding of transformer T1. Actually, the effect of the coupling capacitors 27 and 28 in the square-wave generator 12 is to prevent an abrupt transition so that the current waveform has rather appreciable rise and fall times, but this is not considered to be deleterious since only a very small portion of the voltage amplitude available across the secondary winding of transformer T1 is required to drive the two transistors 18 and 19 alternately to saturation. Also, the application of a somewhat rounded waveform of current to the primary winding of transformer T1 permits this transformer to be of smaller size and utilize less iron; the application of a true square wave of current to a small transformer of this type would ordinarily result in undesirable ringing effects.

The output voltage of the secondary winding of transformer T1 causes the bases of the two transistors 18 and 19 to be alternately driven positive with respect to their collectors which are both connected to the center tap of the secondary winding. During the interval that transistor 18 has its base driven positive with respect to its collector, current is permitted to flow from the positive wire 15 supplying the direct-current signal, through the emitter-collector circuit of transistor 18, and the primary winding of transformer T2 paralleled by capacitor 20, to the common wire 16. As a result, capacitor 20 can, during this interval, charge to the amplitude of the direct-current voltage appearing between wires 15 and 16. In a similar manner, during the interval that transistor 19 has its base driven positively with respect to its collector, current can flow from wire 31, through the emitter-collector circuit of this transistor 19, and also through the parallel combination of the primary winding of transformer T2 and capacitor 20, to the common wire 16. Thus, during this particular interval, capacitor 20 can charge to whatever amplitude of voltage is then present on wire 31.

As the square-wave generator operates repetitively to permit conduction of the two transistors 18 and 19 alternately, the voltage across capacitor 20 alternately assumes the two voltage levels described above. The actual effect, therefor, is to produce an alternating voltage across this capacitor. The frequency of this alternating voltage is fixed and is determined by the output frequency of the square-wave generator 12. The amplitude of the voltage is variable, however, and is equal to the difference in amplitudes of the two voltages to which the capacitor 20 is alternately charged. Merely as an example, if the voltage provided by the direct-current signal source 10 between wires 15 and 16 equals 5 millivolts (5000 microvolts) and a direct-current signal of 4950 microvolts appears on wire 31 relative to wire 16, then the effective alternating voltage appearing across capacitor as it is alternately charged to these two voltages is the difference in the amplitudes of these two voltages which equals 50 microvolts.

This alternating voltage appearing also across the primary winding of transformer T2 induces a corresponding voltage across the secondary winding which is applied as an input signal to the first of the three iterative amplifier stages including the three transistors 32, 33, and 34. Each of these three transistors has its base connected to the common wire 35 through a biasing resistor and parallel by-pass capacitor such as the resistor 36 and capacitor 37 associated with the first transistor 32. An operating bias voltage level for each transistor selected to obtain a high degree of temperature compensation is obtained by the connection of its base to the junction of two voltage dividing resistors connected in series between the (—) and (+) voltage terminals. This is shown by the connection of the base of transistor 33 to the junction of resistors 38 and 39.

The collector of each transistor is connected through a resistor, such as resistor 40 in the collector circuit of transistor 33, to the (—) terminal, while the collector of transistor 32 is connected to this (—) terminal through the additional series resistor 41. This series resistor 41, in combination with the capacitor 42 connected from wire 43 to the common wire 35, functions as a decoupling filter for the base and collector supply voltages supplied to transistor 32, thereby tending to prevent oscillations which might otherwise be generated across a common impedance in the power supply for the successive stages.

The output signal appearing across the collector resistor of each amplifier stage is capacitor coupled to the base-emitter circuit of the next stage. Thus, the output signal of transistor 32 appearing across its collector resistor 44 is applied through capacitor 45 directly to the base of transistor 33. Each emitter resistor such as resistor 36 has a relatively large value of resistance. This has the effect of providing an essentially constant emitter current source, thereby increasing its stability with changes in temperature. Thus, the by-passing of each emitter resistance such as resistor 36 by a capacitor such as capacitor 37 has the effect of minimizing the degeneration that would otherwise occur.

The greatly amplified alternating-current signal appearing between the collector of transistor 34 and wire 35 is applied to the output rectifier and servo control circuit 14. This circuit 14 comprises two voltage doubling rectifiers, one of which applies a small portion of the rectified output signal to the comparator 11 and the other of which provides the useful output of the amplifier organization across the terminals 46 and 47. Described somewhat more specifically, each negative half-cycle of collector voltage of transistor 34 permits capacitor 48 to charge fully through the low forward resistance provided by rectifier 49. This charging circuit also includes the capacitor 50 which, in effect, provides a zero impedance connection for the signal frequency from the amplifier common wire 35 to the system common or ground wire 16 because of its large value of capacitance. The charging action causes capacitors 48 and 50 to charge to substantially the negative peak value of the collector output signal of transistor 34.

On each positive half-cycle at the collector of transistor 34, effectively no current can flow through rectifier 49 because of its high back resistance. At such time current can, however, flow through both of two parallel paths. One of these paths includes rectifier 51 in the low resistance, forward direction, resistor 52, resistor 53, wire 16, and capacitor 50, back to the emitter circuit of transistor 34 over the wire 35. The other path includes rectifier 54 also in the low resistance, forward direction, resistor 55, to wire 16 and back to the emitter circuit of transistor 34 in the same manner as described for the other path. Because of the relatively high resistance provided by resistors 52 and 53 in the one path and by resistor 55 in the other path, capacitor 48 can discharge on each positive half-cycle only an insignificant amount of the charge it receives on each negative half-cycle. Consequently, on each positive half-cycle, substantially the full peak-to-peak amplitude of the collector voltage of transistor 34 appears as a direct-current voltage between wire 56 and the common wire 16, with wire 56 being positive with respect to wire 16. Because of the low forward resistance of the two rectifiers 51 and 54 for the above-mentioned polarity of voltage, it may be considered that the entire available voltage appears across the resistor 55 and also across the series-connected voltage dividing resistors 52 and 53.

Resistor 55 is shunted by the capacitor 57 which has the effect of filtering the output signal, thereby providing a relatively smooth direct-current output voltage across the two output terminals 46 and 47. This filter capacitor 57 has practically no effect upon the voltage acrosss the series resistors 52 and 53 because of the blocking effect of rectifier 54. Thus, as the unfiltered voltage across the series resistors 52 and 53 momentarily drops below the maximum attainable peak-to-peak voltage, the charged filter capacitor 57 is prevented from discharging through these resistors to maintain the voltage level at its upper peak because of the blocking effect provided by the high back resistance of rectifier 54. This is highly desirable in that it permits the voltage on wire 31 to instantly follow changes in the amplitude of the voltage at the collector of transistor 34. In other words, this organization of the output rectifier and servo control circuit 14 permits the output signal between terminals 46 and 47 to be filtered and yet does not introduce any appreciable time constant with respect to the servo control voltage appearing on wire 31.

The relative values of the two voltage dividing resistors 52 and 53 are preferably so selected that, for a given signal level provided by the direct-current signal source 10 and effective to produce a corresponding output amplitude, the voltage on wire 31 will be very nearly equal to the signal amplitude supplied at that instant by the source 10. Thus, in one specific embodiment of this invention, the resistance of resistor 53 was selected to be approximately one thousandth of the resistance of resistor 52. More specifically, since the open loop gain of the three amplifier stages including the three transistors 32, 33, and 34 was arranged to be about 100,000, an output signal across terminals 46 and 47 of 5 volts could be obtained with an effective alternating voltage across capacitor 20 of 50 microvolts. This 50 microvolts could be provided by an avialable voltage of 5 millivolts from the direct current signal source 10 in conjunction with a voltage of 4.95 millivolts on wire 31 from the servo control circuit 14. Obviously, with 5 volts available across the two series resistors 52 and 53, 4.95 millivolts could be obtained on wire 31 by selecting resistor 53 to be approximately one thousandth of the value of resistor 52. The enumeration of these particular values is given merely for purposes of illustration to aid in the description of the present invention, and is not intended in any manner to define the limits thereof.

The manner in which this servo control organization of this invention is instrumental in providing improved stability of operation will now be described. Thus, it will be first assumed that, under maximum gain conditions of the three amplifier stages including the three transistors 32, 33, and 34, a certain prescribed amplitude of the output signal across terminals 46 and 47 is obtained for a corresponding amplitude of signal from the direct-current signal source 10. If the open loop gain should now decrease as a result, for example, of an increase in the ambient temperature, there would be a tendency for the voltage across the output terminals 46 and 47 to decrease. This decrease would be accompanied, however, by a corresponding decrease in the voltage on wire 31. As a result, for the same amplitude of signal between wires 15 and 16, there would now be a greater difference in the respective voltages on wires 15 and 31 as compared to the common wire 16 so that there would be an effective increase in the alternating voltage on the capacitor 20. This greater amplitude of input signal would produce an output of greater amplitude to compensate for the lower gain. Any tendency for overcorrection is compensated for since an increase in the output signal amplitude would increase the voltage level on the wire 31 and tend to reduce the difference in level between the voltages on the respective wires 15 and 31, thereby reducing the effective input signal to the first amplifier stage and reducing the signal level at the collector of transistor 34.

From the description that has been given of the action of the servo control circuit 14, as it operates to compensate for a decrease in open loop amplifier gain, it will be apparent that, proper polarities of the various connections must be observed. Thus, if the signal provided by the direct-current signal source 10 is of a polarity that causes wire 15 to be positive with respect to the common wire 16 as has been assumed, then the polarity of voltage provided by the output rectifier and servo control circuit 14 to wire 31 must also cause this wire to be positive with respect to wire 16.

It also follows that, although the amplifier of this invention is organized to cope with substantial reductions in open loop amplifier gain, it can accommodate only moderate increases in the open loop gain. The reason for this is that a very large increase of gain would then cause the voltage on wire 31 to be larger than the voltage on wire 15 rather than smaller. Then an increase of signal at the collector of transistor 34 resulting in an increase of voltage on wire 31, would produce an even larger alternating voltage across capacitor 20. An unstable operating condition would immediately result. This situation is not, however, considered to be a serious drawback particularly when bias stabilized transistor amplification is used because the tendency is for the open loop gain to decrease, not to increase.

It will be noted that the wire 16 provides a common ground for both the input and output circuits. The common wire 35 for the three amplifier stages is isolated from the wire 16 only by the blocking capacitor 50. As previously mentioned, this capacitor 50 is chosen to have a sufficiently large value of capacitance that the wire 35 is always at substantially the same voltage as the wire 16 with respect to the alternating-current signal being amplified, but the use of the blocking capacitor 50 prevents the positive voltage of the (+) terminal from appearing on the common ground wire 16.

To summarize the mode of operation of the servo control circuit of this invention, it may be said that there is provided a means by which the direct-current output voltage of the amplifier organization is directly utilized by comparing a predetermined portion of it with the input signal to provide an error signal that is actually an alternating-current voltage suitable for amplification by the iterative amplifier stages that are provided. An effective zero time constant permits the voltage on wire 31 to reflect instantly all changes in amplitude of the output signal so that the error signal being amplified at each instant represents current conditions.

The particular embodiment of this invention shown in the accompanying drawing and described herein includes transistor amplifier stages rather than those using electron discharge tubes. One particular advantage of the use of transistors is that there is then practically zero phase shift in the system, thereby tending to improve the stability of operation. However, it should be understood that the principles of this invention are in no way limited to an organization using transistors but can equally well be applied in their broadest concept to electron tube, magnetic, or other types of amplifiers.

Having described a direct-current amplifier with improved operating characteristics as one specific embodiment of this invention, I desire it to be understood that various modifications, adaptations, and alterations may be made to the specific form shown to meet the requirements of practice without in any manner departing from the spirit or scope of this invention.

What I claim is:

1. In an electronic circuit organization for the amplification of direct-current voltages, amplifier means for amplifying an alternating-current voltage, first output rectifier circuit means for rectifying and filtering the alternating-current output signal of said amplifier circuit means to provide thereby a corresponding direct-current output voltage, second rectifier circuit means for rectifying the alternating-current output signal of said amplifier circuit means to provide thereby a corresponding unfiltered unidirectional voltage, voltage dividing circuit means having said unfiltered unidirectional voltage applied thereto for providing a direct-current control voltage being at all times a preselected small portion of said unfiltered unidirectional voltage comparator circuit means having applied thereto both said direct-current voltage to be amplified and said control voltage provided by said voltage dividing circuit means for providing an alternating-current amplifier input signal voltage having its amplitude proportional to the difference in amplitude of said two voltages applied thereto, circuit means for applying said amplifier input signal to said amplifier means whereby the gain of said circuit organization is made more stable.

2. In an amplifier for direct-current signals, the combination comprising, alternating-current voltage amplifier circuit means, output circuit means connected to the output of said amplifier circuit means and including first means for rectifying and filtering the output of said amplifier circuit means to provide thereby a direct-current output of said amplifier and also including second means for rectifying the output of said amplifier circuit means to provide thereby an unfiltered unidirectional voltage, voltage dividing circuit means having said unfiltered unidirectional voltage applied thereto for providing a direct-current voltage being at all times a preselected small portion of said unfiltered unidirectional voltage, comparator circuit means for providing as an input signal to said amplifier circuit means an alternating-current voltage signal having an amplitude proportional to the difference in amplitudes of the direct-current signal to be amplified and said voltage provided by said voltage dividing circuit means, whereby the output of said amplifier circuit means has its amplitude substantially independent of the gain of said amplifier circuit means.

3. In an amplifier for direct-current voltages, the combination comprising, a storage capacitor, alternating-current voltage amplifier circuit means, a transformer having its primary winding energized with the voltage across said storage capacitor and supplying the voltage induced in its secondary winding to the input of said amplifier circuit means, first and second rectifier circuit means being responsive to the alternating-current output of said amplifier circuit means to provide separate direct-current voltages each proportional to the amplitude of the alternating-current output of said amplifier circuit means, voltage dividing circuit means having the unfiltered rectified output of said first rectifier circuit means applied thereto for providing an unfiltered direct-current voltage which is a predetermined very small portion of the total rectified voltage provided by said first rectifier circuit means, switching circuit means for alternately charging said storage capacitor at a predetermined rate to the direct-current voltage to be amplified and to the voltage provided by said voltage dividing circuit means, said predetermined very small portion of voltage being selected to be somewhat less in amplitude than the direct-current voltage to be amplified, whereby an alternating-current voltage is produced in said storage capacitor or having an amplitude equal to the difference in amplitude of the voltage to be amplified and the voltage provided by said voltage dividing circuit means, and filtering means associated with said second rectifier circuit means to provide a filtered direct-current output signal.

4. In an electronic circuit organization for the amplification of a direct-current voltage, direct-current voltage amplitude storing means, alternating-current amplifier circuit means, first output rectifier and filtering circuit means connected to the output of said amplifier circuit means for providing a filtered direct-current voltage having its amplitude at all times proportional to the output amplitude of said amplifier circuit means, second rectifier circuit means being also connected to the output of said amplifier circuit means and providing an unfiltered unidirectional voltage also having its amplitude at all times proportional to the output amplitude of said amplifier circuit means, voltage dividing circuit means having said unfiltered unidirectional voltage applied thereto for providing an unfiltered voltage which is continually a preselected small portion of said unidirectional voltage applied thereto, circuit means for causing both the direct-current voltage to be amplified and the unfiltered voltage provided by said voltage dividing circuit means to be alternately stored in said voltage amplitude storage means at a predetermined rate, said amplifier circuit means amplifying the alternating voltage thus appearing in said storage means, whereby the amplitude of the voltage provided by said output rectifier circuit means is independent of variation in gain of said amplifier circuit means.

5. In an amplifier for direct-current signals, the combination comprising, a storage capacitor, alternating-current voltage amplifier circuit means comprising a plurality of temperature-compensated cascaded transistor amplifier stages, transformer circuit means being inductively responsive to the alternating voltage across said capacitor to provide an alternating input signal to said amplifier circuit means, first rectifier circuit means and associated filtering means being responsive to the output of said amplifier circuit means to provide an output direct-current voltage at all times proportional to the direct-current input signal, second rectifier circuit means also being responsive to the output of said amplifier circuit means and being effective to provide an unfiltered direct-current signal to an associated voltage divider, said voltage divider providing an output voltage being a predetermined small portion of the signal applied to it, circuit means comprising two transistors being alternately and oppositely controlled to respective conductive and cut-off states, the first of said transistors when conductive permitting the charging of said storage capacitor to said direct-current input signal, the second of said transistors when conductive permitting the charging of said storage capacitor to the unfiltered direct-current voltage provided by said voltage divider, whereby the output of said amplifier has its amplitude substantially independent of the gain of said amplifier circuit means.

6. In an electronic circuit organization for the amplification of direct-current voltages, a storage capacitor, switching circuit means having two inputs and a single output, said direct-current voltage to be amplified being applied to one of said inputs, said output of said switching circuit means being connected to said storage capacitor, alternating-current amplifier means for amplifying the voltage across said capacitor, first rectifier and associated filtering means for rectifying and filtering the output voltage of said amplifier means, second rectifier circuit means being also responsive to the alternating output voltage of said alternating-current amplifier means to provide an unfiltered direct-current voltage proportional in amplitude to the alternating-current voltage output of said amplifier circuit means, voltage divider circuit means having said unfiltered voltage applied thereto and being effective to provide a small portion of said unfiltered voltage to said second input of said switching circuit means with the same polarity as said direct-current voltage applied to said first input, and circuit means effectively connecting said first and said second inputs of said switching circuit means to said output thereof alternately at a preselected rate, said amplifier circuit means being organized to have essentially zero phase shift characteristics over a limited frequency range including said preselected rate, whereby the output of said first rectifier and associated filtering means is maintained directly proportional to said direct current voltage being amplified irrespective of variations in gain of said amplifier circuit means.

7. In an amplifier for direct-current voltages, the combination comprising, storage means for momentarily storing the amplitude of a direct-current voltage, switching circuit means comprising two transistors, circuit means for causing said two transistors to be oppositely and alternately controlled to respective cut-off and conductive conditions, one of said transistors when made conductive being effective to cause the amplitude of the input direct-current voltage to be stored in said storage circuit means, alternating-current voltage amplifier circuit means being responsive to the voltage stored in said storage means, first rectifier circuit means and associated filtering means for rectifying and filtering the output voltage of said amplifier circuit means, second rectifier circuit means being also responsive to the alternating output voltage of said amplifier means to provide an unfiltered direct-current voltage proportional in amplitude to the alternating voltage output of said amplifier means, voltage divider circuit means having said unfiltered voltage applied thereto and being effective to provide a small portion of said unfiltered voltage to the second of said two transistors included in said switching circuit means to thereby cause said portion of said unfiltered voltage to be stored in said storage means when said second transistor is made conductive, said portion of said unfiltered voltage being caused to have the same polarity as said input voltage, whereby the output of said first rectifier and associated filtering means is maintained directly proportional to said direct-current voltage being amplified irrespective of variations in gain of said amplifier circuit means.

8. An amplifier for direct-current input voltages comprising, a storage capacitor, alternating-current voltage amplifier circuit means comprising a plurality of transistor amplifier stages, biasing circuit means associated with each of said transistor amplifier stages to lessen its gain variations with respect to changes of temperature, transformer circuit means being inductively responsive to the alternating voltage produced across said storage capacitor to provide an alternating input signal to said amplifier circuit means, servo control circuit means associated with the output of the last of said transistor amplifier stages and comprising, first voltage doubling rectifier circuit means including a series-connected capacitor and first rectifier having the output signal of said last stage applied thereto, a series combination of a second rectifier and a first resistance connected in parallel with said first rectifier with said second rectifier poled oppositely with respect to said first rectifier, another series combination comprising a third rectifier and second resistance connected in parallel with said first resistance with said third rectifier poled the same as said second rectifier, filtering circuit means associated with said second resistance, comparator circuit means comprising two transistors being alternately and oppositely controlled between respective conductive and nonconductive states at a predetermined frequency, the first of said transistors when conductive permitting the charging of said storage capacitor with the input direct-current signal, the second of said transistors when conductive permitting the charging of said storage capacitor with a portion of the voltage appearing across said first resistance, said portion of said voltage provided by said first resistance being of the same polarity and being of substantially the same order of magnitude as direct-current input signal being effective to produce the output signal across said first resistance, whereby the output of said amplifier has its amplitude substantially independent of the gain of said amplifier circuit means.

9. An amplifier for direct-current signals comprising in combination; alternating-current amplifier means; output circuit means connected to the output of said amplifier means and including; a first means providing a rectified and filtered direct-current amplifier output signal having an amplitude proportional to the alternating-current output of said amplifier circuit means, and second means providing a unidirectional voltage having a short time-constant and having its amplitude proportional to and quickly following variations in the amplitude of the output of said amplifier circuit means; comparator circuit means having applied thereto and being controlled alternately by the direct-current signal to be amplified and a predetermined small portion of said short time-constant voltage for providing an alternating input signal to said amplifier circuit means having an amplitude proportional to the difference in amplitudes of said two signals respectively supplied thereto.

10. The combination of claim 9 wherein said unidirectional short time constant voltage is unfiltered.

11. In an electronic circuit organization for the amplification of a direct-current voltage, direct-current voltage amplitude storing means, alternating-current amplifier circuit means, first output rectifier and filtering means connected to the output of said amplifier circuit means for providing a filtered direct-current amplifier output voltage having its amplitude at all times proportional to the output amplitude of said amplifier circuit means, second rectifier means being also connected to the output of said amplifier circuit means and providing a unidirectional voltage having its amplitude also at all times proportional to the output amplitude of said amplifier circuit means but being substantially unfiltered as compared to said amplifier output voltage, means having said unidirectional voltage applied thereto for providing a control voltage which is a predetermined small portion of said unidirectional voltage, means for causing both said direct-current voltage desired to be amplified and said control voltage to be alternately and repetitively stored in said storing means at a predetermined rate, said amplifier circuit means amplifying the alternating voltage thus appearing in said storing means, whereby the amplitude of said amplifier output voltage is independent of variations in gain of said amplifier circuit means.

References Cited in the file of this patent

UNITED STATES PATENTS

| | | |
|---|---|---|
| 2,297,543 | Eberhardt et al. | Sept. 29, 1942 |
| 2,559,245 | Fay | July 3, 1951 |
| 2,701,309 | Barney | Feb. 1, 1955 |
| 2,707,752 | Gabler | May 3, 1955 |
| 2,756,286 | Johnson et al. | July 24, 1956 |
| 2,773,946 | Greenberg et al. | Dec. 11, 1956 |
| 2,832,848 | Neff | Apr. 29, 1958 |

FOREIGN PATENTS

| | | |
|---|---|---|
| 71,982 | Denmark | Dec. 27, 1950 |

OTHER REFERENCES

Bright et al.: "Transistor . . . Amplifiers," Electronics, April 1955, pages 135–137.